US008082481B2

(12) United States Patent
Casper et al.

(10) Patent No.: US 8,082,481 B2
(45) Date of Patent: Dec. 20, 2011

(54) MULTIPLE CRC INSERTION IN AN OUTPUT DATA STREAM

(75) Inventors: Daniel F. Casper, Poughkeepsie, NY (US); John R. Flanagan, Poughkeepsie, NY (US); Roger G. Hathorn, Tucson, AZ (US); Catherine C. Huang, Poughkeepsie, NY (US); Matthew J. Kalos, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 971 days.

(21) Appl. No.: 12/030,938

(22) Filed: Feb. 14, 2008

(65) Prior Publication Data

US 2009/0210769 A1    Aug. 20, 2009

(51) Int. Cl.
*H03M 13/00* (2006.01)
(52) U.S. Cl. ........................................ 714/758; 370/394
(58) Field of Classification Search .................. 714/758; 370/394
See application file for complete search history.

(56) References Cited

U.S. PATENT DOCUMENTS

| 3,943,283 | A | 3/1976 | Caragliano et al. |
| 4,004,277 | A | 1/1977 | Gavril |
| 4,374,415 | A | 2/1983 | Cormier et al. |
| 4,380,046 | A | 4/1983 | Frosch et al. |
| 4,455,605 | A | 6/1984 | Cormier et al. |
| 4,760,518 | A | 7/1988 | Potash et al. |
| 4,779,188 | A | 10/1988 | Gum et al. |
| 4,837,677 | A | 6/1989 | Burrus, Jr. et al. |
| 4,866,609 | A | 9/1989 | Calta et al. |
| 4,870,566 | A | 9/1989 | Cooper et al. |
| 5,016,160 | A | 5/1991 | Lambeth et al. |
| 5,031,091 | A | 7/1991 | Wakatsuki et al. |
| 5,040,108 | A | 8/1991 | Kanazawa |
| 5,386,512 | A | 1/1995 | Crisman et al. |
| 5,388,219 | A | 2/1995 | Chan et al. |
| 5,410,727 | A | 4/1995 | Jaffe et al. |
| 5,434,980 | A | 7/1995 | Casper et al. |
| 5,440,729 | A | 8/1995 | Kimura et al. |
| 5,461,721 | A | 10/1995 | Cormier et al. |

(Continued)

FOREIGN PATENT DOCUMENTS

DE    3931514    3/1990

(Continued)

OTHER PUBLICATIONS

U.S. Appl. No. 12/031,201 Final Office Action dated Jun. 13, 2011.

(Continued)

*Primary Examiner* — Guy Lamarre
(74) *Attorney, Agent, or Firm* — Cantor Colburn LLP; John Campbell

(57) ABSTRACT

A computer program product includes a tangible storage medium readable by a processing circuit and storing instructions for execution by the processing circuit for performing a method. The method includes receiving a message to transmit from the channel subsystem to the control unit. The method also includes determining a first CRC insertion position, and receiving a first CRC calculated over a first block of data in the message. The method additionally includes inserting the first calculated CRC at the first CRC insertion position, and determining a second CRC insertion position. The method further includes receiving a second CRC calculated over a second block of data in the message, and inserting the second calculated CRC at the second CRC insertion position.

24 Claims, 11 Drawing Sheets

U.S. PATENT DOCUMENTS

| | | |
|---|---|---|
| 5,465,359 A | 11/1995 | Allen et al. |
| 5,500,942 A | 3/1996 | Eickemeyer et al. |
| 5,526,484 A | 6/1996 | Casper et al. |
| 5,539,918 A | 7/1996 | Allen et al. |
| 5,546,533 A | 8/1996 | Koyama |
| 5,561,809 A | 10/1996 | Elko et al. |
| 5,584,039 A | 12/1996 | Johnson et al. |
| 5,600,793 A | 2/1997 | Nord |
| 5,613,163 A | 3/1997 | Marron et al. |
| 5,640,600 A | 6/1997 | Satoh et al. |
| 5,758,190 A | 5/1998 | Johnson et al. |
| 5,768,620 A | 6/1998 | Johnson et al. |
| 5,831,985 A | 11/1998 | Sandorfi |
| 5,860,022 A | 1/1999 | Kondou et al. |
| 5,894,583 A | 4/1999 | Johnson et al. |
| 5,901,327 A | 5/1999 | Ofek |
| 5,918,028 A | 6/1999 | Silverthorn et al. |
| 6,226,771 B1 * | 5/2001 | Hilla et al. .................. 714/758 |
| 6,230,218 B1 | 5/2001 | Casper et al. |
| 6,343,335 B1 | 1/2002 | Dahman et al. |
| 6,353,612 B1 | 3/2002 | Zhu et al. |
| 6,484,217 B1 | 11/2002 | Fuente et al. |
| 6,546,435 B1 | 4/2003 | Yoshimura et al. |
| 6,584,511 B1 | 6/2003 | Marsh, III et al. |
| 6,609,161 B1 | 8/2003 | Young |
| 6,647,016 B1 | 11/2003 | Isoda et al. |
| 6,651,125 B2 | 11/2003 | Maergner et al. |
| 6,658,603 B1 | 12/2003 | Ward |
| 6,693,880 B2 | 2/2004 | Gregg et al. |
| 6,694,390 B1 | 2/2004 | Bogin et al. |
| 6,751,680 B2 | 6/2004 | Langerman et al. |
| 6,772,207 B1 | 8/2004 | Dorn et al. |
| 6,826,661 B2 | 11/2004 | Umbehocker et al. |
| 6,839,773 B2 | 1/2005 | Vishlitzky et al. |
| 6,862,322 B1 | 3/2005 | Ewen et al. |
| 6,898,202 B2 | 5/2005 | Gallagher et al. |
| 6,915,378 B2 | 7/2005 | Roberti |
| 7,000,036 B2 | 2/2006 | Carlson et al. |
| 7,003,700 B2 | 2/2006 | Elko et al. |
| 7,020,810 B2 | 3/2006 | Holman |
| 7,035,540 B2 | 4/2006 | Finan et al. |
| 7,058,735 B2 | 6/2006 | Spencer |
| 7,100,096 B2 | 8/2006 | Webb, Jr. et al. |
| 7,111,130 B2 | 9/2006 | Blake et al. |
| 7,120,728 B2 | 10/2006 | Krakirian et al. |
| 7,124,207 B1 | 10/2006 | Lee et al. |
| 7,133,988 B2 | 11/2006 | Fujibayashi |
| 7,149,823 B2 | 12/2006 | Miller et al. |
| 7,164,425 B2 | 1/2007 | Kwak et al. |
| 7,202,801 B2 | 4/2007 | Chou |
| 7,277,387 B2 | 10/2007 | Sanders et al. |
| 7,315,911 B2 | 1/2008 | Davies et al. |
| 7,382,733 B2 | 6/2008 | Banerjee et al. |
| 7,395,284 B2 | 7/2008 | Sato et al. |
| 7,398,335 B2 | 7/2008 | Sonksen et al. |
| 7,484,021 B2 | 1/2009 | Rastogi et al. |
| 7,500,030 B2 | 3/2009 | Hathorn et al. |
| 7,502,873 B2 | 3/2009 | Casper et al. |
| 7,539,777 B1 | 5/2009 | Aitken |
| 7,543,087 B2 | 6/2009 | Philbrick et al. |
| 7,555,554 B2 | 6/2009 | Manders et al. |
| 7,558,827 B2 | 7/2009 | Kawashima et al. |
| 7,564,791 B2 | 7/2009 | Jayakrishnan et al. |
| 7,577,772 B2 | 8/2009 | Sonksen et al. |
| 7,577,773 B1 | 8/2009 | Gandhi et al. |
| 7,594,057 B1 | 9/2009 | Gandhi et al. |
| 7,599,360 B2 | 10/2009 | Edsall et al. |
| 7,711,871 B1 | 5/2010 | Haechten et al. |
| 7,743,197 B2 | 6/2010 | Chavan et al. |
| 7,765,336 B2 | 7/2010 | Butler et al. |
| 7,826,349 B2 | 11/2010 | Kaur et al. |
| 7,840,717 B2 | 11/2010 | Flanagan et al. |
| 7,840,718 B2 | 11/2010 | Ricci et al. |
| 7,840,719 B2 | 11/2010 | Casper et al. |
| 7,856,511 B2 | 12/2010 | Ricci et al. |
| 2001/0030943 A1 | 10/2001 | Gregg et al. |
| 2002/0062407 A1 | 5/2002 | Tateyama et al. |
| 2002/0099967 A1 | 7/2002 | Kawaguchi |
| 2002/0152338 A1 | 10/2002 | Elliott et al. |
| 2002/0178404 A1 | 11/2002 | Austen et al. |
| 2003/0056000 A1 | 3/2003 | Mullendore et al. |
| 2003/0084213 A1 | 5/2003 | Brice, Jr. et al. |
| 2003/0158998 A1 | 8/2003 | Smith |
| 2003/0188053 A1 | 10/2003 | Tsai |
| 2004/0030822 A1 | 2/2004 | Rajan et al. |
| 2004/0054776 A1 | 3/2004 | Klotz et al. |
| 2004/0113772 A1 | 6/2004 | Hong Chou |
| 2004/0136241 A1 | 7/2004 | Rapp et al. |
| 2004/0151160 A1 | 8/2004 | Sanders et al. |
| 2004/0193968 A1 | 9/2004 | Dugan et al. |
| 2004/0210719 A1 | 10/2004 | Bushey et al. |
| 2004/0260851 A1 | 12/2004 | Tu |
| 2005/0018673 A1 | 1/2005 | Dropps et al. |
| 2005/0102456 A1 | 5/2005 | Kang |
| 2005/0105456 A1 | 5/2005 | Cookson et al. |
| 2005/0108251 A1 | 5/2005 | Hunt |
| 2005/0175341 A1 | 8/2005 | Ovadia |
| 2005/0204069 A1 | 9/2005 | Carlson et al. |
| 2005/0223291 A1 | 10/2005 | Zimmer et al. |
| 2005/0257118 A1 | 11/2005 | Shien |
| 2006/0036769 A1 | 2/2006 | Frey et al. |
| 2006/0050726 A1 | 3/2006 | Ahmed et al. |
| 2006/0085595 A1 | 4/2006 | Slater |
| 2006/0159112 A1 | 7/2006 | Sundaram et al. |
| 2006/0224795 A1 | 10/2006 | Muto et al. |
| 2007/0005838 A1 | 1/2007 | Chang et al. |
| 2007/0016554 A1 | 1/2007 | Dapp et al. |
| 2007/0061463 A1 | 3/2007 | Hiramatsu et al. |
| 2007/0072543 A1 | 3/2007 | Paila et al. |
| 2007/0079051 A1 | 4/2007 | Tanaka et al. |
| 2007/0091497 A1 | 4/2007 | Mizuno et al. |
| 2007/0162631 A1 | 7/2007 | Balakrishnan et al. |
| 2007/0174544 A1 | 7/2007 | Yasuda et al. |
| 2007/0239944 A1 | 10/2007 | Rupanagunta et al. |
| 2007/0294697 A1 | 12/2007 | Theimer et al. |
| 2008/0040519 A1 | 2/2008 | Starr et al. |
| 2008/0059638 A1 | 3/2008 | Hathorn et al. |
| 2008/0147889 A1 | 6/2008 | Casper et al. |
| 2008/0147890 A1 | 6/2008 | Casper et al. |
| 2008/0183877 A1 | 7/2008 | Carlson et al. |
| 2008/0235553 A1 | 9/2008 | Chintada et al. |
| 2008/0256264 A1 | 10/2008 | Muto et al. |
| 2008/0273518 A1 | 11/2008 | Pratt et al. |
| 2008/0307122 A1 | 12/2008 | Butler et al. |
| 2009/0055585 A1 | 2/2009 | Fernandes et al. |
| 2009/0144586 A1 | 6/2009 | Casper et al. |
| 2009/0172203 A1 | 7/2009 | Casper et al. |
| 2009/0210557 A1 | 8/2009 | Gainey, Jr. et al. |
| 2009/0210559 A1 | 8/2009 | Flanagan et al. |
| 2009/0210560 A1 | 8/2009 | Yudenfriend et al. |
| 2009/0210561 A1 | 8/2009 | Ricci et al. |
| 2009/0210562 A1 | 8/2009 | Huang et al. |
| 2009/0210563 A1 | 8/2009 | Flanagan et al. |
| 2009/0210564 A1 | 8/2009 | Ricci et al. |
| 2009/0210570 A1 | 8/2009 | Bendyk et al. |
| 2009/0210571 A1 | 8/2009 | Casper et al. |
| 2009/0210572 A1 | 8/2009 | Yudenfriend et al. |
| 2009/0210573 A1 | 8/2009 | Yudenfriend et al. |
| 2009/0210576 A1 | 8/2009 | Casper et al. |
| 2009/0210579 A1 | 8/2009 | Bendyk et al. |
| 2009/0210580 A1 | 8/2009 | Bendyk et al. |
| 2009/0210581 A1 | 8/2009 | Flanagan et al. |
| 2009/0210582 A1 | 8/2009 | Bendyk et al. |
| 2009/0210583 A1 | 8/2009 | Bendyk et al. |
| 2009/0210584 A1 | 8/2009 | Carlson et al. |
| 2009/0210585 A1 | 8/2009 | Ricci et al. |
| 2009/0210768 A1 | 8/2009 | Carlson et al. |
| 2009/0210884 A1 | 8/2009 | Ricci et al. |
| 2009/0307388 A1 | 12/2009 | Tchapda |
| 2010/0014526 A1 | 1/2010 | Chavan et al. |
| 2010/0064072 A1 | 3/2010 | Tang et al. |

FOREIGN PATENT DOCUMENTS

| | | |
|---|---|---|
| GB | 1264096 | 2/1972 |
| GB | 2291990 | 2/1996 |

| | | |
|---|---|---|
| JP | 63236152 | 10/1988 |
| JP | 2010-140127 A | 6/2010 |
| WO | 2006102664 A2 | 9/2006 |

OTHER PUBLICATIONS

U.S. Appl. No. 12/946,514, Non-Final Office Action Mailed Jun. 23, 2011.

U.S. Appl. No. 12/183,323, Notice of Allowance Mailed Jun. 23, 2011.

Cakmakci, Melih, et al. "Bi-Directional Communication amoung "Smart" Compoents in a Networked Control System", University of Michigan: Department of Mechanical Engineering, 2005 American control conference, Jun. 8-10, 2005, Portland, OR, pp. 627-632.

U.S. Appl. No. 12/031,182, Non Final Office Action Mailed Dec. 23, 2010.

U.S. Appl. No. 12/030,920, Notice of Allowance Mailed Dec. 28, 2010.

U.S. Appl. No. 12/030,954, Notice of Allowance mailed Dec. 28, 2010.

U.S. Appl. No. 12/030,932, Non-Final Office Action Mailed Dec. 16, 2010.

U.S. Appl. No. 12/031,023, Final Office Action Mailed Nov. 18, 2010.

U.S. Appl. No. 12/031,201, Non-Final Office Action Mailed Dec. 27, 2011.

U.S. Appl. No. 12/030,985, Notice of Allowance mailed Nov. 24, 2010.

U.S. Appl. No. 12/030,993, Final Office Action Mailed Dec. 10, 2010.

U.S. Appl. No. 12/183,315, Notice of Allowance Mailed Dec. 13, 2010.

U.S. Appl. No. 12/183,323, Non-Final Office Action Mailed Jan. 3, 2011.

Ishikawa, Hikaru, et al. "Bi-Directional OFDM Transmission using Adaptive Modulation that spreads Data Symbols". Power Line Communications and its Applications, 2006, IEEE International Symposium on, vol., No., pp. 202-207.

Tachikawa, T., et al. "ARQ protocols for bi-directional data transmission," Information Networking, 1998 (ICOIN-12) Proceedings., Twelfth International Conference on., vol., No., pp. 468-473, Jan. 21-23, 1998.

Dauby, et al. "Contention Resolution Between Two Processors"; IBM Technical Disclosure Bulletin; vol. 26; No. 10A; Mar. 1984; 3 pages.

DeVeer, J.A.; "Control Frame Multiplexing on Serial I/O Channels"; IBM Technical Disclosure Bulletin; vol. 32; No. 10A; Mar. 1990; pp. 39-40.

"Information Technology-Fibre Channel Protocol for SCSI, Third Version (FCP-3)," T10 Project 1560-D, Revision 4g, Sep. 13, 2005.

U.S. Appl. No. 12/031,038 Non-Final Office Action dated Nov. 16, 2009.

U.S. Appl. No. 12/030,975 Non-Final Office Action dated Oct. 22, 2009.

U.S. Appl. No. 12/030,932 Non-Final Office Action dated Dec. 16, 2009.

U.S. Appl. No. 12/031,023 Non-Final Office Action dated Oct. 29, 2009.

U.S. Appl. No. 12/030,951 Non-Final Office Action dated Nov. 23, 2009.

U.S. Appl. No. 12/030,961 Non-Final Office Action dated Dec. 17, 2009.

U.S. Appl. No. 12/030,939 Non-Final Office Action dated Nov. 16, 2009.

U.S. Appl. No. 12/030,989 Non-Final Office Action dated Oct. 22, 2009.

U.S. Appl. No. 12/030,993 Non-Final Office Action dated Oct. 28, 2009.

U.S. Appl. No. 12/031,021 Non-Final Office Action dated Jan. 8, 2010.

U.S. Appl. No. 12/181,662—Non-Final Office Action dated Jun. 18, 2009.

U.S. Appl. No. 12/181,662—Final Office Action dated Jan. 4, 2010.

International Search Report and Written Opinion for PCT/EP2009/051447 dated Jul. 1, 2009.

International Search Report and Written Opinion for PCT/EP2009/051483 dated Jul. 27, 2009.

Written Opinion and International Search Report for PCT/EP2009/051445 dated Jun. 25, 2009.

Written Opinion and International Search Report for PCT/EP2009/051446 dated Jun. 25, 2009.

Written Opinion and International Search Report for PCT/EP2009/051462 dated Jul. 1, 2009.

Written Opinion and International Search Report for PCT/EP2009/051450 dated Jul. 7, 2009.

Written Opinion and International Search Report for PCT/EP2009/051459 dated Jun. 23, 2009.

Written Opinion and International Search Report for PCT/EP2009/051463 dated Jul. 22, 2009.

Nordstrom.; "Sequence Reception Method for a Fibre Channel Protocol Chip"; IBM Technical Disclosure Bulletin; vol. 38, No. 12; Dec. 1995; pp. 267-269.

U.S. Appl. No. 11/548,060 Non-Final Office Action dated Apr. 15, 2008.

U.S. Appl. No. 11/548,093 Non-Final Office Action dated Apr. 17, 2008.

"Protocol for Insochronous Traffic Over Fiber Channel Switching"; IBM Technical Disclosure Bulletin; vol. 37, No. 06B; Jun. 1994. pp. 377-380.

Golasky, Richard; "Link-Level Error Recovery With Tape Backup"; Dell Power Solutions; Aug. 2005; pp. 88-91.

Sachs, M.W.; "I/O Marker Changing"; IBM Technical Disclosure Bulletin; vol. 37, No. 02A; Feb. 1994; pp. 75-76.

Snively, et al.; "Fibre Channel, Framing and Signaling"; (FC-FS) Rev. 1.70; NCITS Working Draft Proposed American National Standard for Information Technology; Feb. 2002; pp. i-575.

Srikrishnan et al.; "Sharing FCP Adapters Through Virtualization"; IBM J. Res. & Dev., vol. 51, No. 1/2; Jan./Mar. 2007; pp. 103-118.

U.S. Appl. No. 12/183,315, filed Jul. 31, 2008.

U.S. Appl. No. 12/183,323, filed Jul. 31, 2008.

U.S. Appl. No. 12/183,305, filed Jul. 31, 2008.

"z/Architecture-Principles of Operation," IBM Publication No. SA22-7832-04, 5th Ed., Sep. 2005.

U.S. Appl. No. 12/030,912 Non-Final Office Action dated Mar. 18, 2010.

U.S. Appl. No. 12/030,920 Non-Final Office Action dated Feb. 23, 2010.

U.S. Appl. No. 12/030,954 Non-Final Office Action dated Jan. 21, 2010.

Written Opinion and International Search Report for PCT/EP2009/051461 dated Sep. 22, 2009.

U.S. Appl. No. 12/031,182 Non-Final Office Action dated Jan. 22, 2010.

U.S. Appl. No. 12/031,201 Non-Final Office Action dated Jan. 25, 2010.

International Search Report; International Application No. PCT/EP2009/059184; International Filing Date: Jul. 16, 2009; Date of mailing: Jan. 14, 2010; 9 pages.

Brice, et al.; U.S. Appl. No. 11/464,613; "Flexibility Controlling The Transfer Of Data Between Input/Output Devices And Memory"; filed Aug. 15, 2006; Specification having 23 pages and Drawings having 4 sheets.

Casper, et al.; U.S. Appl. No. 11/548,060; "Facilitating Input/Output Processing by Using Transport Control Words to Reduce Input/Output Communications"; filed Oct. 16, 2006; Specification having 32 pages and Drawings having 12 sheets.

"IBM® z/Architecture Principles of Operation", Publication No. SA22-7832-05, 6th Edition, Apr. 2007. 1,215 pages separated into 4 electronic attachments.

Iren, et al.; "The Transport Layer: Tutorial and Survey"; ACM Computing Surveys; vol. 31, No. 4; Dec. 1999; pp. 360-405.

Peterson, David; "Information Techonology, Fibre Channel Protocol for SCSI, Fourth Version (FCP-3)", Draft Proposed American National Standard, Jun. 2004; pp. 1-142.

Simmons, et al.; "A Performance Comparison of Three Supercomputers: Fujitsu VP-2600, NEC SX-3, and CRAY Y-MP";

ACM, Conference on High Performance Networking and Computing, Proceedings of the 1991 ACM/IEEE conference on Supercomputing, Albuquerque, New Mexico; Jul. 1991; pp. 150-157.
Snively, et al.; "Fibre Channel Single Byte Command Code Sets-3 Mapping Protocol (FC-SB-3)"; T11/Project 1357-D/Rev. 1.6, INCITS; Mar. 2003; pp. 1-206.
Stone, et al.; "When the CRC and TCP Checksum Disagree"; SIGCOMM '00, Stockholm, Sweden; Jul. 2000; 10 pages.
Aboda, B.-et al.; Network Working Group; "Securing Block Storage Protocols Over IP"; ACM Digital Library; RFC3723; Apr. 2004.
Azimi, R.-et al.; "miNI: Reducing Network Interface Memory Requirements with Dynamic Handle Lookup"; ACM Digital Library; pp. 261-272; Jun. 2003.
Emulex Corporation; "Install the LP850 Host Adapter"; Google/Emulex Corporation, LightPulse LP850 Fibre Channel PCI Host Adapter Manuals; pp. 1-10, 1999.
Foong, A.-et al.; "Towards SSD-Ready Enterprise Platforms"; Google/Intel Corporation; 2008-2009.
Hewlett-Packard Company; HP A4800A PCI FWD SCSI Host Bus Adapter—Service & User Guide, Edition 6; Google/H-P; 2001.
Hewlett-Packard Company; "HP A5149 PCI Ultra2 SCSI Host Bus Adapter—Service and User Guide", Edition 2; Google/H-P; 2001.
POU920070301US1, U.S. Appl. No. 12/030,951, Notice of Allowance Mailed Apr. 4, 2011.
POU920060228US2, U.S. Appl. No. 12/364,615, Notice of Allowance Mailed Mar. 10, 2011.
Jiang, J.-et al.; "The Role of FCoE in I/O Consolidation"; ACM Digital Library/International Conf on Advanced Infocomm Technology '08; Jul. 2008.
Josephson, WK.-et al.; "DFS: A File System for Virtualized Flash Storage"; ACM Digital Library; vol. 6, No. 3, Article 14, Sep. 2010.
LSI Corporation; "PCI Express to 6Gb/s SAS Host Bus Adapters"; GOOGLE; Chapter 1, Introduction/Overview; LSI User Guide; Oct. 2009.
LSI; "ScsiPortGetDeivceBase"; GOOGLE/LSI; Apr. 2003.
Magoutis, K.; "The Optimistic Direct Access File System: Design and Network Interface Support"; Division of Engineering & Applied Science, Harvard Univ.; Feb. 2002.
Miller, DJ.-et al.; "Motivating Future Interconnects: A Differential Measurement Analysis of PCI Latency"; ACM Digital Library; pp. 94-105; Oct. 2009.
Network Storage Systems; Google; Oct. 2007.
Sun, Oracle; "Sun Storage 6 Gb SAS PCIe HBA, External—Installation Guide for HBA Models"; Google; Revision A; Nov. 2010.
Petersen, MK.-et al.; "DIF/DIX Aware Linux SCSI HBA Interface"; Google; Oracle Linux Engineering; Jul. 2008.
Satran, J.-et al.; Network Working Group; "Internet Small Computer Systems Interface (iSCSI)"; ACM Digital Library; RFC3720; Apr. 2004.
Vaghani, SB.; "Virtual Machine File System"; VMWare Inc./ACM Digital Library; pp. 57-69; 2008-2009.
U.S. Appl. No. 12/030,939 Notice of Alllowance mailed Jun. 29, 2010.
U.S. Appl. No. 12/030,954 Non Final Office Action mailed Jul. 12, 2010.
U.S. Appl. No. 12/030,961 Final Office Action mailed Jul. 12, 2010.
U.S. Appl. No. 12/030,993 Non Final Office Action mailed Jun. 28, 2010.
U.S. Appl. No. 12/031,021 Notice of Allowance mailed Jul. 8, 2010.
U.S. Appl. No. 12/031,023 Non Final Office Action mailed Jun. 11, 2010.
U.S. Appl. No. 12/183,323 Non Final Office Action mailed Jul. 19, 2010.
U.S. Appl. No. 12/392,246 Notice of Allowance mailed Jul. 15, 2010.
U.S. Appl. No. 12/030,967 Restriction Requirement Mailed Dec. 29, 2009.
ANSI INCITS 433-2007, Information Technology Fibre Channel Link Services (FC-LS), Jul. 2007.
Fibre Channel Single Byte Command Code Sets-2 Mapping Protocol (FC-SB-3), T11/Project 1357-D/Rev 1.6, INCITS Mar. 2003.
U.S. Appl. No. 12/030,951 Non-Final Office Action dated May 20, 2010.
U.S. Appl. No. 12/031,038, Non-Final Office Action Mailed Apr. 15, 2010.
U.S. Appl. No. 12/030,975. Final Office Action Mailed May 13, 2010.
U.S. Appl. No. 12/030,967, Notice of Allowance mailed Apr. 23, 2010.
U.S. Appl. No. 12/030,985, Non Final Office Action Mailed May 5, 2010.
U.S. Appl. No. 12/031,042, Non-Final Office Action Mailed Apr. 5, 2010.
U.S. Appl. No. 12/031,021, Notice of Allowance Mailed Apr. 30, 2010.
U.S. Appl. No. 12/183,305, Non-Final Office Action Mailed May 11, 2010.
U.S. Appl. No. 12/183,315 Notice of Allowance dated Jun. 15, 2010.
U.S. Appl. No. 12/030,989 Final Office Action dated May 24, 2010.
SCSI Primary Commands—4 (SPC-4); Project T10/1731-D. Rev 11. INCITS Apr. 14, 2010.
Behrs, JR, "Adaptive Prediction Minimizes Data Overrun and Underrun", IBM, Nov. 1994, pp. 1-3. http://priorartdatabase.com/IPCOM/000114189.
U.S. Appl. No. 12/031,038, Notice of Allowance Mailed Oct. 6, 2010.
Final Office Action for POU920070216US1 U.S. Appl. No. 12/030,912 mailed Oct. 6, 2010.
POU920070217US1_U.S. Appl. No. 12/031,182 Final Office Action Mailed Jul. 22, 2010.
U.S. Appl. No. 12/030,920 Notice of Allowance Mailed Aug. 23, 2010.
U.S. Appl. No. 12/030,975, Notice of Allowance Mailed Oct. 19, 2010.
U.S. Appl. No. 12/030,932, Final Office Action Mailed Jul. 23, 2010.
U.S. Appl. No. 12/030,951, Final Office Action Mailed Oct. 26, 2010.
U.S. Appl. No. 12/030,961 Notice of Allowance Mailed Nov. 5, 2010.
U.S. Appl. No. 12/030,967 Notice of Allowance Mailed Oct. 7, 2010.
U.S. Appl. No. 12/031,201, Final Office Action Mailed Aug. 3, 2010.
U.S. Appl. No. 12/031,042, Final Office Action Mailed Oct. 25, 2010.
U.S. Appl. No. 12/181,662, Notice of Allowance Mailed Aug. 4, 2010.
U.S. Appl. No. 12/364,615, Non Final Office Action Mailed Oct. 7, 2010.
U.S. Appl. No. 12/183,305, Notice of Allowance Mailed Nov. 1, 2010.
IBM, "Method and Apparatus to Monitor PAV Utilization", Feb. 2005, pp. 1-3. http://priorartdatabase.com/IPCOM/000082878.
Moore et al., Reconfiguration of Storage Elements to Improve Performance, IBM, Dec. 1983, pp. 1-3. http://priorartdatabas.com/IPCOM/000047719.

* cited by examiner

MULTIPLE CRC INSERTION IN AN OUTPUT DATA STREAM

BACKGROUND OF THE INVENTION

1. Field of the Invention

The present disclosure relates generally to input/output processing, and in particular, to insertion of multiple cyclic redundancy check words in an output data stream in an input/output processing system.

2. Description of Background

Input/output (I/O) operations are used to transfer data between memory and I/O devices of an I/O processing system. Specifically, data is written from memory to one or more I/O devices, and data is read from one or more I/O devices to memory by executing I/O operations.

To facilitate processing of I/O operations, an I/O subsystem of the I/O processing system is employed. The I/O subsystem is coupled to main memory and the I/O devices of the I/O processing system and directs the flow of information between memory and the I/O devices. One example of an I/O subsystem is a channel subsystem. The channel subsystem uses channel paths as communications media. Each channel path includes a channel coupled to a control unit, the control unit being further coupled to one or more I/O devices.

The channel subsystem may employ channel command words (CCWs) to transfer data between the I/O devices and memory. A CCW specifies the command to be executed. For commands initiating certain I/O operations, the CCW designates the memory area associated with the operation, the action to be taken whenever a transfer to or from the area is completed, and other options.

During I/O processing, a list of CCWs is fetched from memory by a channel. The channel parses each command from the list of CCWs and forwards a number of the commands, each command in its own entity, to a control unit coupled to the channel. The control unit then processes the commands. The channel tracks the state of each command and controls when the next set of commands are to be sent to the control unit for processing. The channel ensures that each command is sent to the control unit in its own entity. Further, the channel infers certain information associated with processing the response from the control unit for each command.

Performing I/O processing on a per CCW basis may involve a large amount of processing overhead for the channel subsystem, as the channels parse CCWs, track state information, and react to responses from the control units. Therefore, it may be beneficial to shift much of the processing burden associated with interpreting and managing CCW and state information from the channel subsystem to the control units. Simplifying the role of channels in communicating between the control units and an operating system in the I/O processing system may increase communication throughput as less handshaking is performed. However, altering command sequences, as well as roles of the channel subsystem and the control units, can cause difficulties in verifying the integrity of large quantities of data exchanged.

Existing communication protocols attempt to append a cyclic redundancy check (CRC) to the end of a message, allowing the receiver to verify message contents prior to taking action in response to the message. In order to fully verify the contents of the message using this approach, a large amount of buffer space may be needed at the receiver to temporarily hold the message until message verification is performed. Therefore, the size of available buffer space at the receiver represents an upper limit to the message size. Presently, if a message is larger than the available buffer size, the message may be subdivided into smaller messages that will fit into the available buffer size. This approach reduces communication and overall I/O processing system throughput, as additional overhead and delays are associated with sending numerous smaller messages. For example, sending multiple smaller messages may require extra support messages to establish locations for writing data in the smaller messages. It would be beneficial to develop an approach to insert verification checkpoints in an output data stream such that a message, which is larger than the available buffer size, can be incrementally verified. Such an approach would avoid the additional overhead and delays associated with subdividing a large message into multiple smaller messages. Accordingly, there is a need in the art for insertion of multiple CRCs in an output data stream in an I/O processing system.

BRIEF SUMMARY OF THE INVENTION

Embodiments of the invention include a computer program product for inserting multiple CRCs in an output data stream from a channel subsystem to a control unit of an I/O processing system. The computer program product includes a tangible storage medium readable by a processing circuit and storing instructions for execution by the processing circuit for performing a method. The method includes receiving a message to transmit from the channel subsystem to the control unit via the output data stream. The method also includes determining a first CRC insertion position in the output data stream, and receiving a first CRC calculated over a first block of data in the message. The method additionally includes inserting the first calculated CRC in the output data stream at the first CRC insertion position, and determining a second CRC insertion position in the output data stream. The method further includes receiving a second CRC calculated over a second block of data in the message, and inserting the second calculated CRC in the output data stream at the second CRC insertion position.

Additional embodiments include an apparatus for inserting multiple CRCs in an output data stream in an I/O processing system. The apparatus includes a channel subsystem in communication with a control unit in the I/O processing system. The channel subsystem performs a method. The method includes receiving a message to transmit from the channel subsystem to the control unit via the output data stream. The method also includes determining a first CRC insertion position in the output data stream, and receiving a first CRC calculated over a first block of data in the message. The method further includes inserting the first calculated CRC in the output data stream at the first CRC insertion position, and determining a second CRC insertion position in the output data stream. The method additionally includes receiving a second CRC calculated over a second block of data in the message, and inserting the second calculated CRC in the output data stream at the second CRC insertion position.

Further embodiments include method for inserting multiple CRCs in an output data stream from a channel subsystem to a control unit of an I/O processing system. The method includes receiving a message to transmit from the channel subsystem to the control unit via the output data stream, and determining a first CRC insertion position in the output data stream. The method further includes receiving a first CRC calculated over a first block of data in the message, and inserting the first calculated CRC in the output data stream at the first CRC insertion position. The method additionally includes determining a second CRC insertion position in the output data stream, and receiving a second CRC calculated over a second block of data in the message. The method also includes inserting the second calculated CRC in the output data stream at the second CRC insertion position.

Other computer program products, apparatuses, and/or methods according to embodiments will be or become apparent to one with skill in the art upon review of the following drawings and detailed description. It is intended that all such additional computer program products, apparatuses, and/or methods be included within this description, be within the scope of the present invention, and be protected by the accompanying claims.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
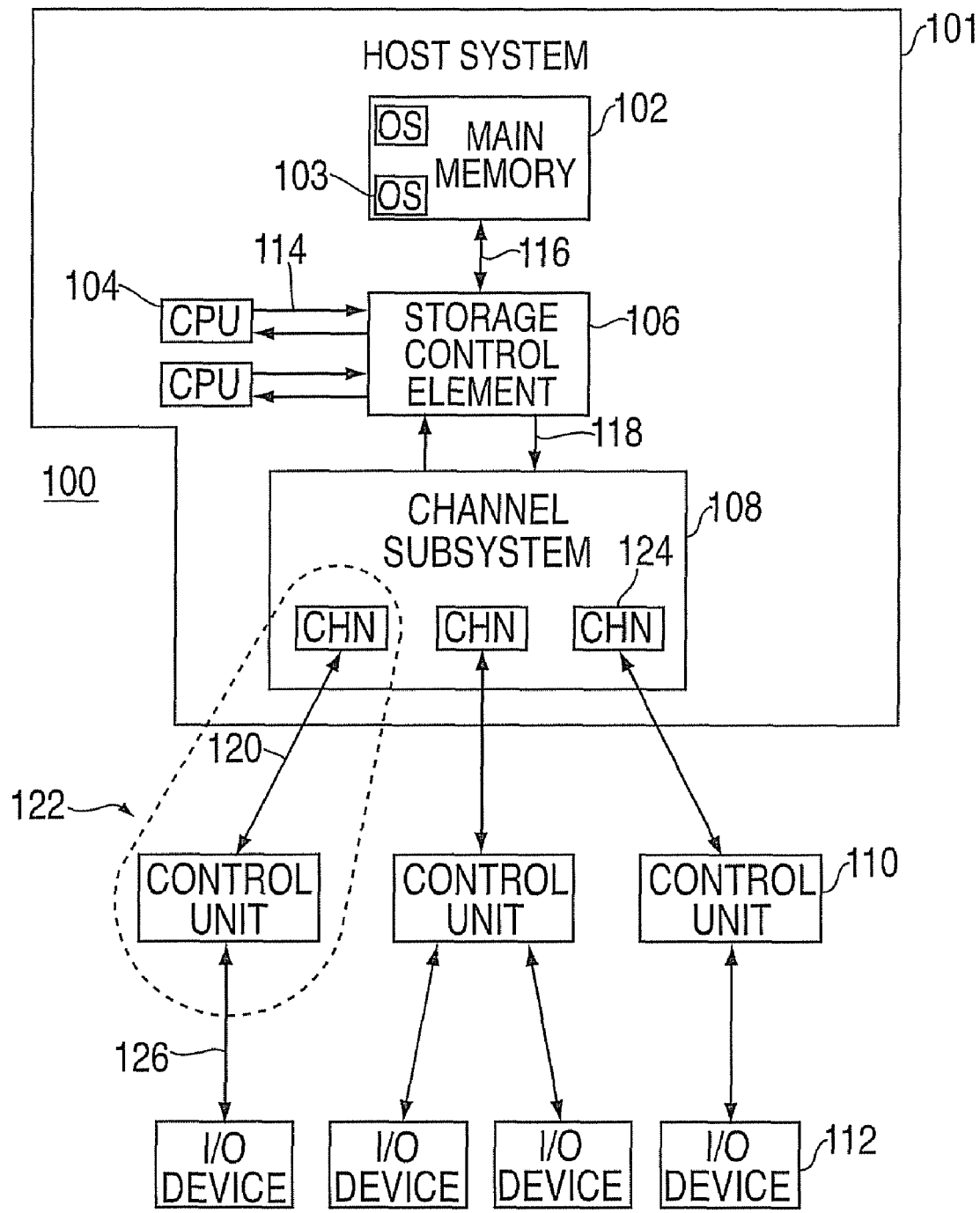
FIG. 1 depicts one embodiment of an I/O processing system incorporating and using one or more aspects of the present invention.

The detailed description explains the preferred embodiments of the invention, together with advantages and features, by way of example with reference to the drawings.

DETAILED DESCRIPTION OF THE INVENTION

In accordance with an aspect of the present invention, input/output (I/O) processing is facilitated. I/O processing is facilitated, in one example, by reducing communications between components of an I/O processing system used to perform the I/O processing. For instance, the number of exchanges and sequences between an I/O communications adapter, such as a channel, and a control unit is reduced. This is accomplished by sending a plurality of commands from the I/O communications adapter to the control unit as a single entity for execution by the control unit, and by the channel sending the data for the commands, if any, as a single entity. The plurality of commands are included in a block, referred to herein as a transport command control block (TCCB), an address of which is specified in a transport control word (TCW). The TCW is sent from an operating system (OS) or other application to the I/O communications adapter, which in turn forwards the TCCB in a command message to the control unit for processing. The control unit processes each of the commands absent a tracking of status relative to those individual commands by the I/O communications adapter. The plurality of commands is also referred to as a channel program, which is parsed and executed on the control unit rather than the I/O communications adapter.

In an exemplary embodiment, the I/O communication adapter inserts incremental cyclic redundancy checks (CRCs) in an output data stream transferring a large data block in a message to the control unit. When multiple CRCs are inserted in the output data stream, they provide verification data for separate blocks within the output data stream that are interpreted by the control unit. The CRCs can be inserted in the output data stream at designated insert positions as checkpoints rather than appending a single CRC to the end of a message. The I/O communications adapter may also insert pad bytes along with each CRC inserted so that blocks in the output data stream start and end on specific boundaries. The checkpoint locations and/or number of pad bytes can be established via a specification between the OS and the control unit. Through inserting multiple CRCs in the output data stream, the control unit can incrementally verify and perform actions in response to the verified portion of the output data stream rather than waiting for a complete message to be received. Moreover, if an error is detected early in the message, the control unit can react prior to receiving and verifying the complete message.

One example of an I/O processing system incorporating and using one or more aspects of the present invention is described with reference to FIG. 1. I/O processing system 100 includes a host system 101, which further includes for instance, a main memory 102, one or more central processing units (CPUs) 104, a storage control element 106, and a channel subsystem 108. The host system 101 may be a large scale computing system, such as a mainframe or server. The I/O processing system 100 also includes one or more control units 110 and one or more I/O devices 112, each of which is described below.

Main memory 102 stores data and programs, which can be input from I/O devices 112. For example, the main memory 102 may include one or more operating systems (OSs) 103 that are executed by one or more of the CPUs 104. For example, one CPU 104 can execute a Linux® operating system 103 and a z/OS® operating system 103 as different virtual machine instances. The main memory 102 is directly addressable and provides for high-speed processing of data by the CPUs 104 and the channel subsystem 108.

CPU 104 is the controlling center of the I/O processing system 100. It contains sequencing and processing facilities for instruction execution, interruption action, timing functions, initial program loading, and other machine-related functions. CPU 104 is coupled to the storage control element 106 via a connection 114, such as a bidirectional or unidirectional bus.

Storage control element 106 is coupled to the main memory 102 via a connection 116, such as a bus; to CPUs 104 via connection 114; and to channel subsystem 108 via a connection 118. Storage control element 106 controls, for example, queuing and execution of requests made by CPU 104 and channel subsystem 108.

In an exemplary embodiment, channel subsystem 108 provides a communication interface between host system 101 and control units 110. Channel subsystem 108 is coupled to storage control element 106, as described above, and to each of the control units 110 via a connection 120, such as a serial link. Connection 120 may be implemented as an optical link, employing single-mode or multi-mode waveguides in a Fibre Channel fabric. Channel subsystem 108 directs the flow of information between I/O devices 112 and main memory 102. It relieves the CPUs 104 of the task of communicating directly with the I/O devices 112 and permits data processing to proceed concurrently with I/O processing. The channel subsystem 108 uses one or more channel paths 122 as the communication links in managing the flow of information to or from I/O devices 112. As a part of the I/O processing, channel subsystem 108 also performs the path-management functions of testing for channel path availability, selecting an available channel path 122 and initiating execution of the operation with the I/O devices 112.

Each channel path 122 includes a channel 124 (channels 124 are located within the channel subsystem 108, in one example, as shown in FIG. 1), one or more control units 110 and one or more connections 120. In another example, it is also possible to have one or more dynamic switches (not depicted) as part of the channel path 122. A dynamic switch is coupled to a channel 124 and a control unit 110 and provides the capability of physically interconnecting any two links that are attached to the switch. In another example, it is also possible to have multiple systems, and therefore multiple channel subsystems (not depicted) attached to control unit 110.

Also located within channel subsystem 108 are subchannels (not shown). One subchannel is provided for and dedicated to each I/O device 112 accessible to a program through the channel subsystem 108. A subchannel (e.g., a data structure, such as a table) provides the logical appearance of a device to the program. Each subchannel provides information concerning the associated I/O device 112 and its attachment to channel subsystem 108. The subchannel also provides information concerning I/O operations and other functions involving the associated I/O device 112. The subchannel is the means by which channel subsystem 108 provides information about associated I/O devices 112 to CPUs 104, which obtain this information by executing I/O instructions.

Channel subsystem 108 is coupled to one or more control units 110. Each control unit 110 provides logic to operate and control one or more I/O devices 112 and adapts, through the use of common facilities, the characteristics of each I/O device 112 to the link interface provided by the channel 124. The common facilities provide for the execution of I/O operations, indications concerning the status of the I/O device 112 and control unit 110, control of the timing of data transfers over the channel path 122 and certain levels of I/O device 112 control.

Each control unit 110 is attached via a connection 126 (e.g., a bus) to one or more I/O devices 112. I/O devices 112 receive information or store information in main memory 102 and/or other memory. Examples of I/O devices 112 include card readers and punches, magnetic tape units, direct access storage devices, displays, keyboards, printers, pointing devices, teleprocessing devices, communication controllers and sensor based equipment, to name a few.

One or more of the above components of the I/O processing system 100 are further described in "IBM® z/Architecture Principles of Operation," Publication No. SA22-7832-05, 6th Edition, April 2007; U.S. Pat. No. 5,461,721 entitled "System For Transferring Data Between I/O Devices And Main Or Expanded Storage Under Dynamic Control Of Independent Indirect Address Words (IDAWS)," Cormier et al., issued Oct. 24, 1995; and U.S. Pat. No. 5,526,484 entitled "Method And System For Pipelining The Processing Of Channel Command Words," Casper et al., issued Jun. 11, 1996, each of which is hereby incorporated herein by reference in its entirety. IBM is a registered trademark of International Business Machines Corporation, Armonk, N.Y. USA. Other names used herein may be registered trademarks, trademarks or product names of International Business Machines Corporation or other companies.

Figure 2A:
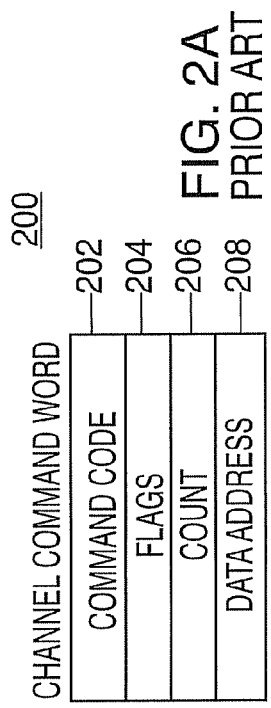
FIG. 2a depicts one example of a prior art channel command word.

In one embodiment, to transfer data between I/O devices 112 and memory 102, channel command words (CCWs) are used. A CCW specifies the command to be executed, and includes other fields to control processing. One example of a CCW is described with reference to FIG. 2*a*. A CCW 200 includes, for instance, a command code 202 specifying the command to be executed (e.g., read, read backward, control, sense and write); a plurality of flags 204 used to control the I/O operation; for commands that specify the transfer of data, a count field 206 that specifies the number of bytes in the storage area designated by the CCW to be transferred; and a data address 208 that points to a location in main memory that includes data, when direct addressing is employed, or to a list (e.g., contiguous list) of modified indirect data address words (MIDAWs) to be processed, when modified indirect data addressing is employed. Modified indirect addressing is further described in U.S. application Ser. No. 11/464,613, entitled "Flexibly Controlling The Transfer Of Data Between Input/Output Devices And Memory," Brice et al., filed Aug. 15, 2006, which is hereby incorporated herein by reference in its entirety.

One or more CCWs arranged for sequential execution form a channel program, also referred to herein as a CCW channel program. The CCW channel program is set up by, for instance, an operating system, or other software. The software sets up the CCWs and obtains the addresses of memory assigned to the channel program. An example of a CCW channel program is described with reference to FIG. 2*b*. A CCW channel program 210 includes, for instance, a define extent CCW 212 that has a pointer 214 to a location in memory of define extent data 216 to be used with the define extent command. In this example, a transfer in channel (TIC) 218 follows the define extent command that refers the channel program to another area in memory (e.g., an application area) that includes one or more other CCWs, such as a locate record 217 that has a pointer 219 to locate record data 220, and one or more write CCWs 221. Each write CCW 220 has a pointer 222 to a data area 224. The data area includes an address to directly access the data or a list of data address words (e.g., MIDAWs or IDAWs) to indirectly access the data. Further, CCW channel program 210 includes a predetermined area in the channel subsystem defined by the device address called the subchannel for status 226 resulting from execution of the CCW channel program.

The processing of a CCW channel program is described with reference to FIG. 3, as well as with reference to FIG. 2*b*. In particular, FIG. 3 shows an example of the various exchanges and sequences that occur between a channel and a control unit when a CCW channel program is executing. The link protocol used for the communications is FICON (Fibre Connectivity), in this example. Information regarding FICON is described in "Fibre Channel Single Byte Command Code Sets-3 Mapping Protocol (FC-SB-3), T11/Project 1357-D/Rev. 1.6, INCITS (March 2003), which is hereby incorporated herein by reference in its entirety.

Referring to FIG. 3, a channel 300 opens an exchange with a control unit 302 and sends a define extent command and data associated therewith 304 to control unit 302. The command is fetched from define extent CCW 212 (FIG. 2b) and the data is obtained from define extent data area 216. The channel 300 uses TIC 218 to locate the locate record CCW and the write CCW. It fetches the locate record command and data 306 (FIG. 3) from the locate record CCW 217 (FIG. 2b) and locate record data 220. The write command and data 308 (FIG. 3) is fetched from write CCW 221 and data area 224 (FIG. 2b). Each is sent to the control unit 302.

The control unit 302 opens an exchange 310 with the channel 300, in response to the open exchange of the channel 300. This can occur before or after locate command and data 306 and/or write command and data 308. Along with the open exchange, a response (CMR) is forwarded to the channel 300. The CMR provides an indication to the channel 300 that the control unit 302 is active and operating.

The control unit 302 provides the status to the channel 300 and closes the exchange 312. In response thereto, the channel 300 stores the data, examines the status and closes the exchange 314, which indicates to the control unit 302 that the status has been received.

The processing of the above CCW channel program to write 4 k of data requires two exchanges to be opened and closed and six sequences. The total number of exchanges and sequences between the channel and control unit is reduced through collapsing multiple commands of the channel program into a TCCB. The channel, e.g., channel 124 of FIG. 1, uses a TCW to identify the location of the TCCB, as well as locations for accessing and storing status and data associated with executing the channel program. The TCW is interpreted by the channel and is not sent or seen by the control unit.

One example of a channel program to write 4 k of data, as in FIG. 2b, but includes a TCCB, instead of separate individual CCWs, is described with reference to FIG. 4. As shown, a channel program 400, referred to herein as a TCW channel program, includes a TCW 402 specifying a location in memory of a TCCB 404, as well as a location in memory of a data area 406 or a TIDAL 410 (i.e., a list of transport mode indirect data address words (TIDAWs), similar to MIDAWs) that points to data area 406, and a status area 408. TIDAW zero 412, TIDAW one 414 and TIDAW two 416 (collectively TIDAWs 412-416) can reference different locations in the data area 406 for acquiring or storing data. The TIDAWs 412-416 can reference non-contiguous blocks of data or contiguous blocks of data. The TIDAWs 412-416 in TIDAL 410 may be located sequentially in memory or located non-contiguously relative to each other. While only three TIDAWs 412-416 are depicted in TIDAL 410, it will be understood that any number of TIDAWs can be included in the TIDAL 410.

The processing of a TCW channel program is described with reference to FIG. 5. The link protocol used for these communications is, for instance, Fibre Channel Protocol (FCP). In particular, three phases of the FCP link protocol are used, allowing host bus adapters to be used that support FCP to perform data transfers controlled by CCWs. FCP and its phases are described further in "Information Technology—Fibre Channel Protocol for SCSI, Third Version (FCP-3)," T10 Project 1560-D, Revision 4, Sep. 13, 2005, which is hereby incorporated herein by reference in its entirety.

Figure 5:
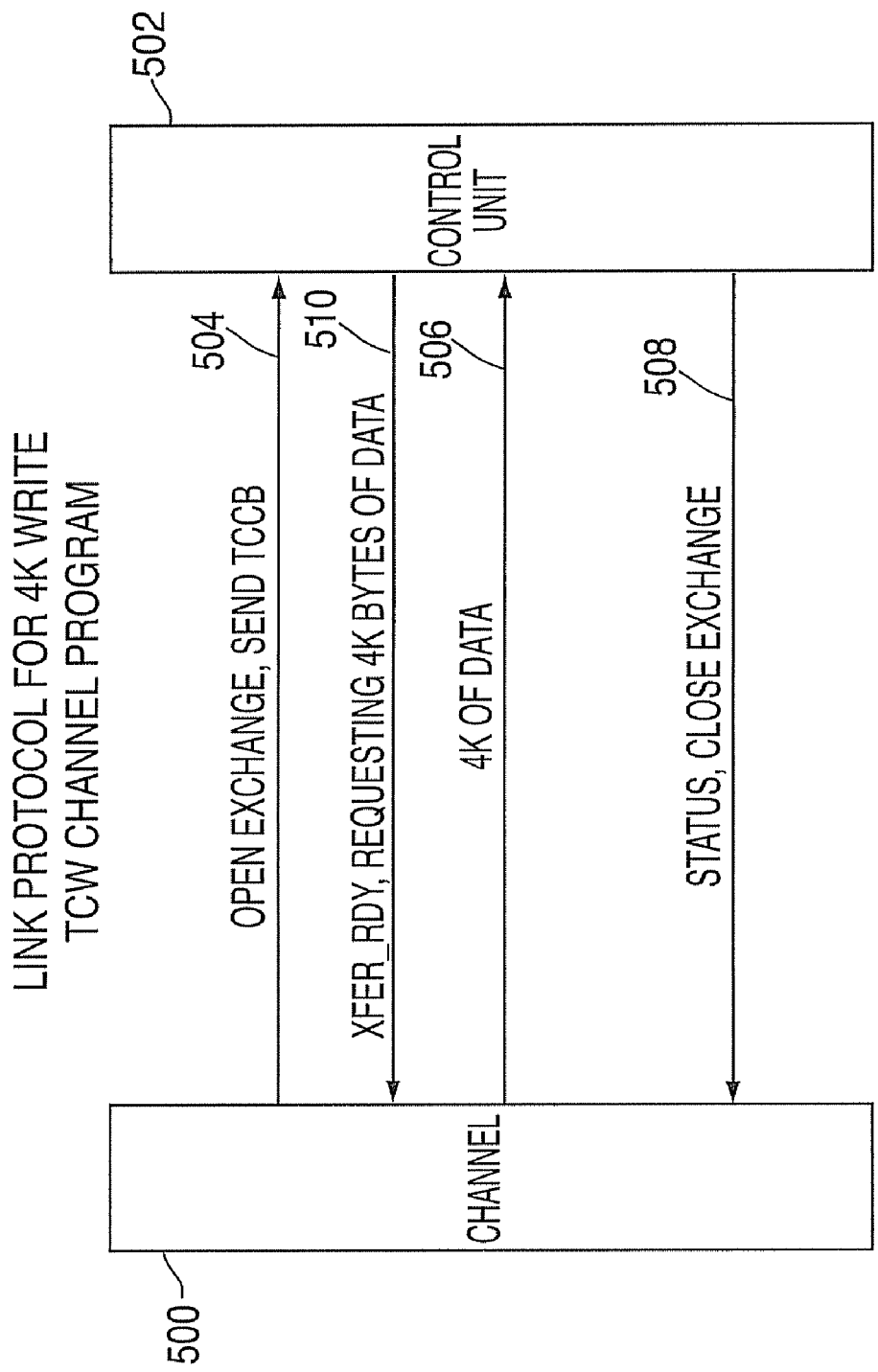
FIG. 5 depicts one embodiment of a link protocol used to communicate between a channel and control unit to execute the transport control word channel program of FIG. 4, in accordance with an aspect of the present invention.

Referring to FIG. 5, a channel 500 opens an exchange with a control unit 502 and sends TCCB 504 to the control unit 502. In one example, the TCCB 504 and sequence initiative are transferred to the control unit 502 in a FCP command, referred to as FCP_CMND information unit (IU) or a transport command IU. The control unit 502 transmits a transfer ready (XFER_RDY) IU 510 to the channel 500 when it is ready to receive data for the write commands received in the TCCB 504. In response to receiving the XFER_RDY IU 510, the channel 500 transfers the data 506 to the control unit 502, via, for instance, a FCP_Data IU. The control unit 502 executes the multiple commands of the TCCB 504 (e.g., define extent command, locate record command, write command as device control words (DCWs)) and writes the data 506 received from the channel 500. It also provides status and closes the exchange 508. As one example, final status is sent in a FCP status frame that has a bit active in, for instance, byte 10 or 11 of the payload of a FCP_RSP IU, also referred to as a transport response IU. The FCP_RSP IU payload may be used to transport FICON ending status along with additional status information.

The embodiment of the link protocol depicted in FIG. 5 is utilized when XFER_RDY is enabled. In the embodiment depicted in FIG. 5, the channel 500 cannot send the data 506 to the control unit 502 until it is requested by the control unit 502 via the XFER_RDY IU 510. In an alternate exemplary embodiment, XFER_RDY is disabled and the control unit does not transmit a XFER_RDY IU 510 to the channel 500. Thus, the channel 500 does not have to wait for the control unit 502 to request the data 506 before sending the data 506. This alternate embodiment, where XFER_RDY is disabled may be utilized when the channel 500 and the control unit 502 are located geographically far apart from each other (e.g., greater than twenty kilometers, greater than fifty kilometers) to improve performance. Unless otherwise specified, the discussion herein assumes that XFER_RDY is enabled.

In a further example, to write 4 k of customer data, the channel 500 uses the FCP link protocol phases, as follows:

1. Transfer a TCCB in the FCP_CMND IU and sequence initiative to the control.
2. Wait for a XFER_RDY IU indicating that the control unit is ready to receive the data.
3. Transfer the IU of data, and sequence initiative to the control unit 502.
4. Final status is sent in a FCP status frame that has a bit active in, for instance, byte 10 or 11 of the FCP_RSP IU Payload. The FCP_RSP_INFO field or sense field is used to transport FICON ending status along with additional status information.

Figure 2B:
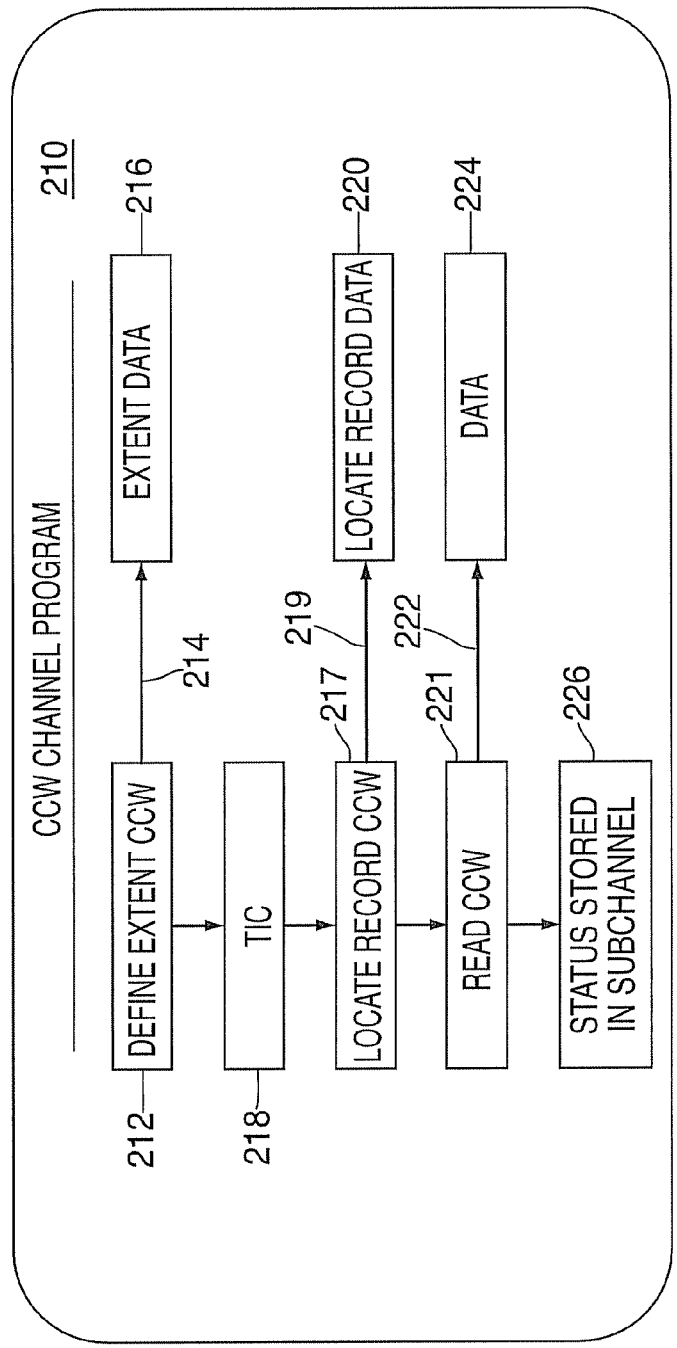
FIG. 2b depicts one example of a prior art channel command word channel program.
Figure 3:
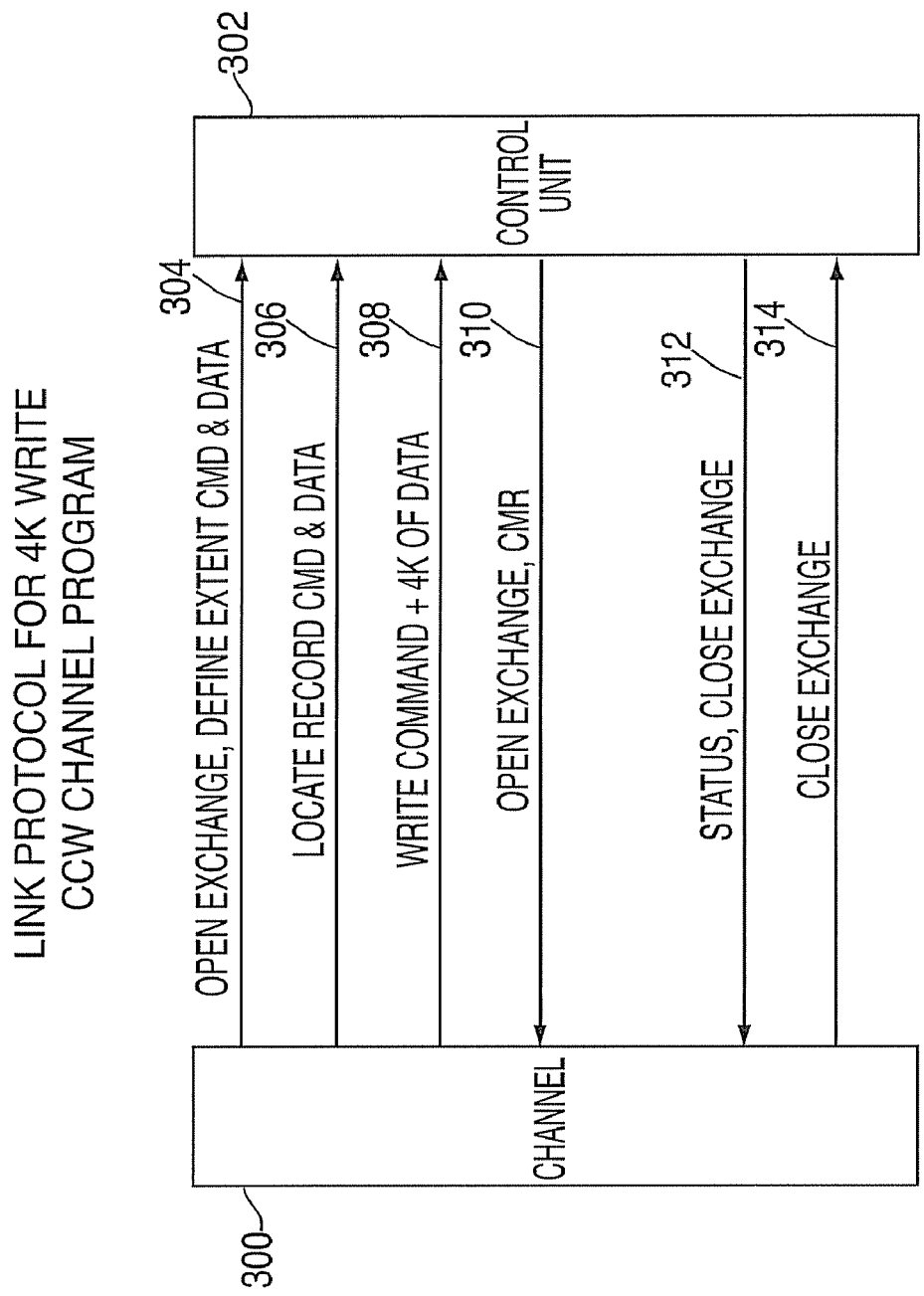
FIG. 3 depicts one embodiment of a prior art link protocol used in communicating between a channel and control unit to execute the channel command word channel program of FIG. 2b.
Figure 4:
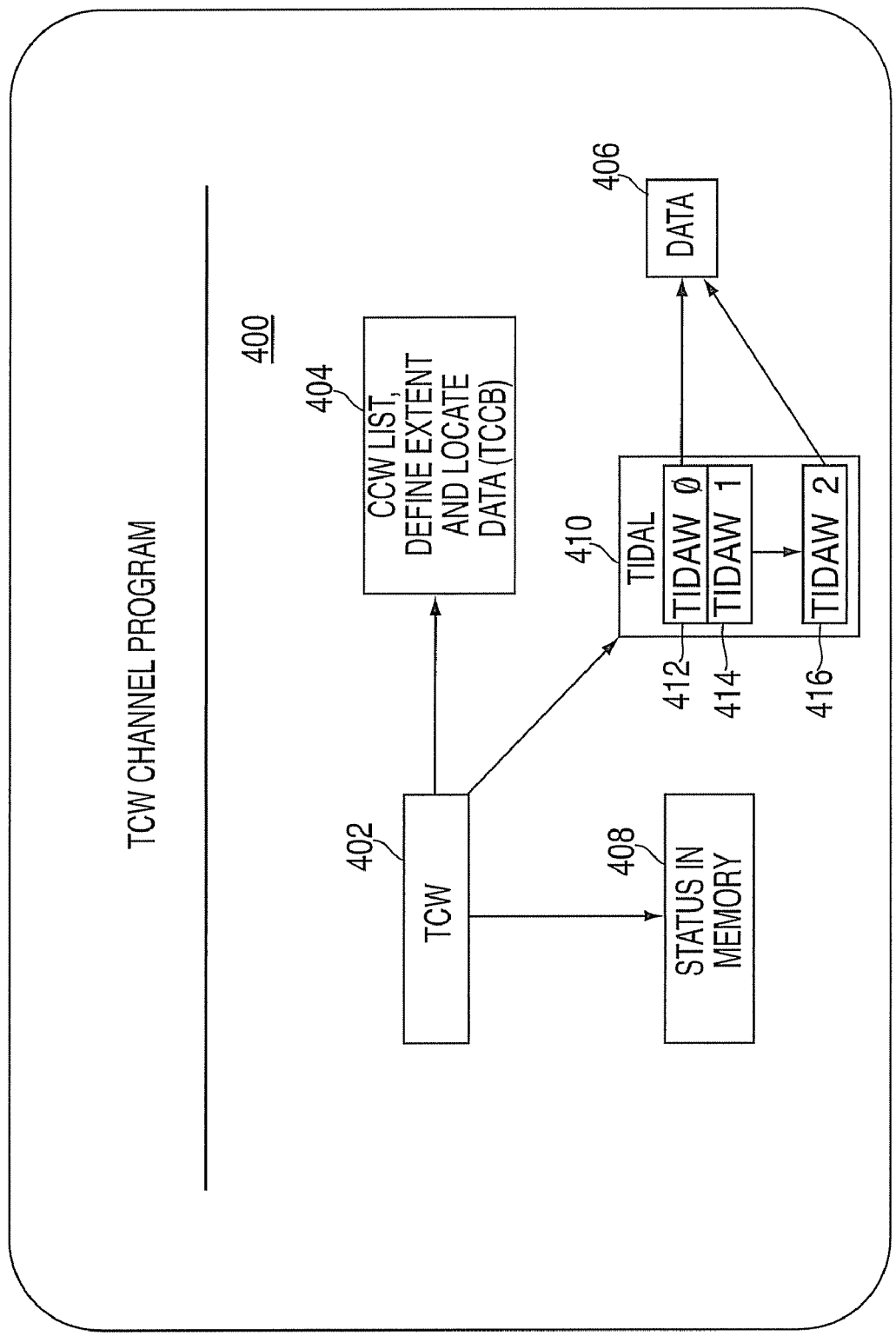
FIG. 4 depicts one embodiment of a transport control word channel program, in accordance with an aspect of the present invention.

By executing the TCW channel program of FIG. 4, there is only one exchange opened and closed (see also FIG. 5), instead of two exchanges for the CCW channel program of FIG. 2b (see also FIG. 3). Further, for the TCW channel program, there are four communication sequences (see FIGS. 4-5), as compared to six sequences for the CCW channel program (see FIGS. 2b-3).

Figure 6:
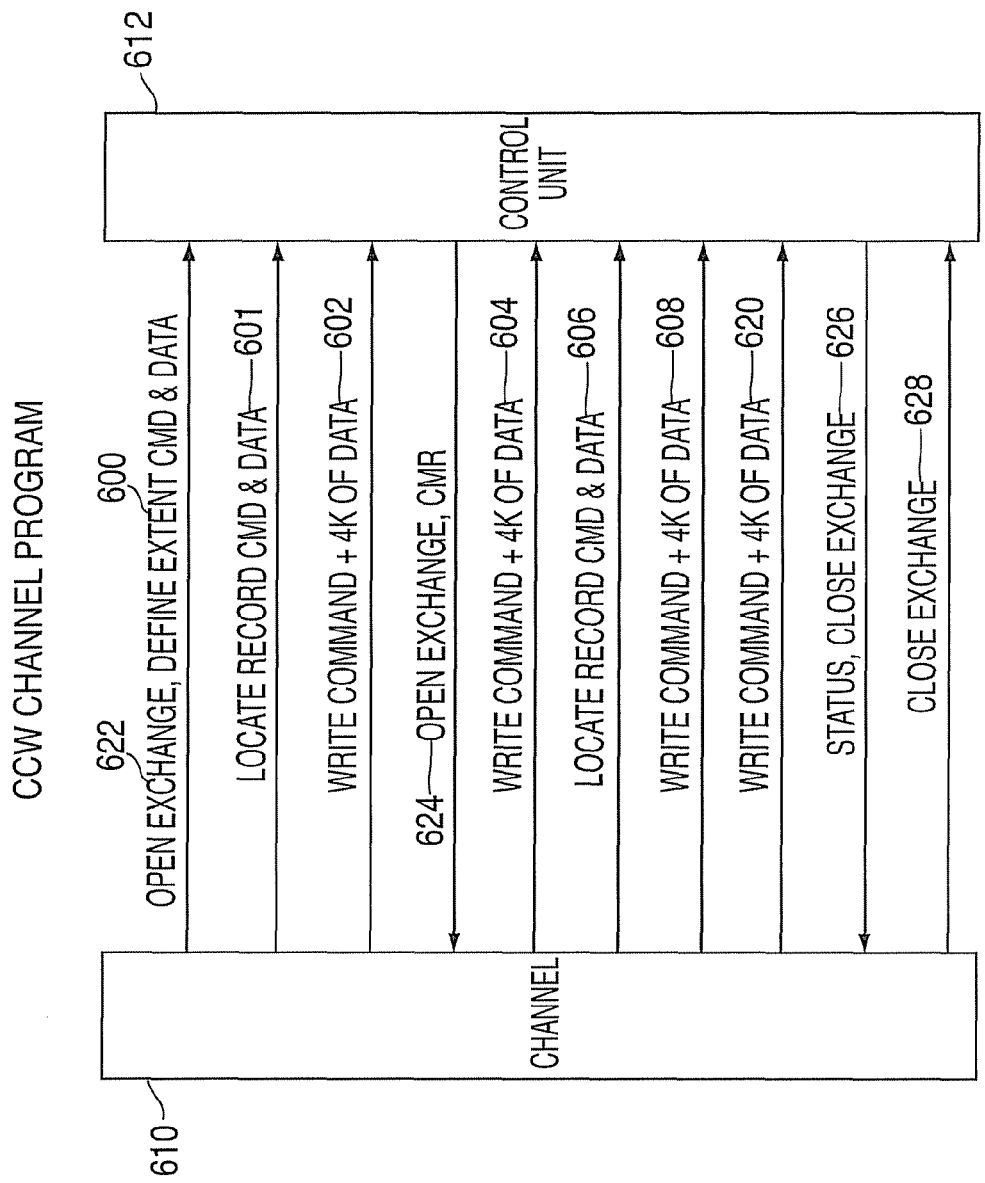
FIG. 6 depicts one embodiment of a prior art link protocol used to communicate between a channel and control unit in order to execute four write commands of a channel command word channel program.

The number of exchanges and sequences remain the same for a TCW channel program, even if additional commands are added to the program. Compare, for example, the communications of the CCW channel program of FIG. 6 with the communications of the TCW channel program of FIG. 7. In the CCW channel program of FIG. 6, each of the commands (e.g., define extent command and data 600, locate record command and data 601, write command and data 602, write command and data 604, locate record command and data 606, write command and data 608, and write command and data 620) are sent in separate sequences from channel 610 to control unit 612. This CCW channel program requires two exchanges to be opened and closed (e.g., open exchanges 622, 624 and close exchanges 626, 628), and ten communications sequences. This is compared to the four sequences and one exchange for the TCW channel program of FIG. 7, which accomplishes the same task as the CCW channel program of FIG. 6.

Figure 7:
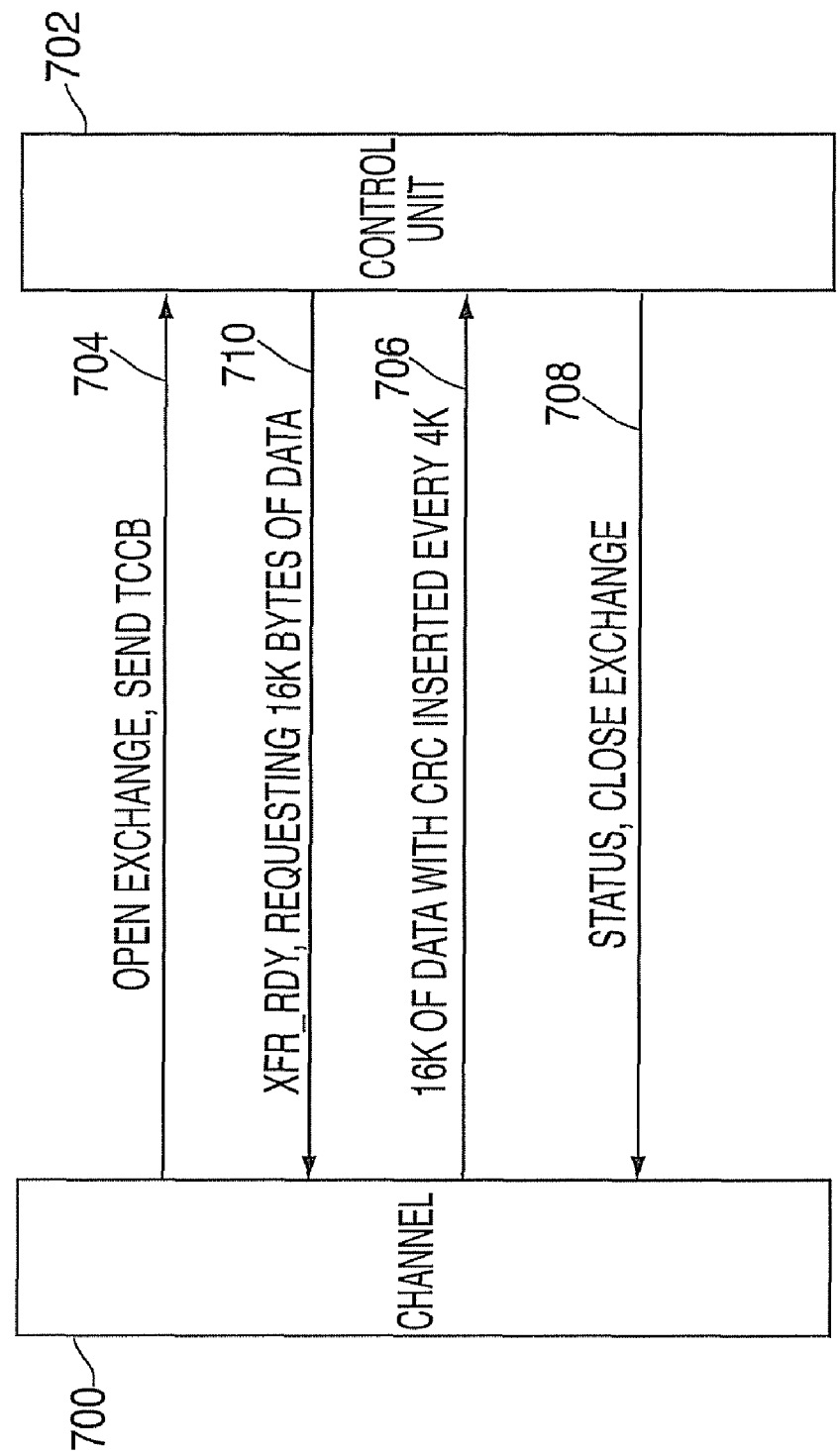
FIG. 7 depicts one embodiment of a link protocol used to communicate between a channel and control unit to process the four write commands of a transport control word channel program, in accordance with an aspect of the present invention.

As depicted in FIG. 7, a channel 700 opens an exchange with a control unit 702 and sends a TCCB 704 to the control unit 702. The TCCB 704 includes the define extent command, the two locate record commands, and the four write commands in DCWs, as described above. Similar to the example depicted in FIG. 5, the control unit 702 may use an XFER_RDY IU 710 to notify the channel 700 that it is ready receive data, provided that XFER_RDY support is not disabled. The channel 700 transmits 16 k of data 706 to the control unit 702 in a single sequence upon receipt of the XFER_RDY IU 710. The channel 700 inserts a CRC every 4K of the 16 k of data 706 in the sequence. The insertion of a CRC every 4K allows the control unit 702 to verify the 16K of data incrementally, rather than buffer the entire 16K for verification before completing the write commands in the TCCB 704. Additionally, the control unit 702 provides status to the channel 700 and closes the exchange 708. Thus, the TCW channel program of FIG. 7 requires much less communications to transfer the same amount of data as the CCW channel program of FIG. 6, while supporting incremental data verification via multiple CRC insertion in the output data stream from the channel 700.

Figure 8:
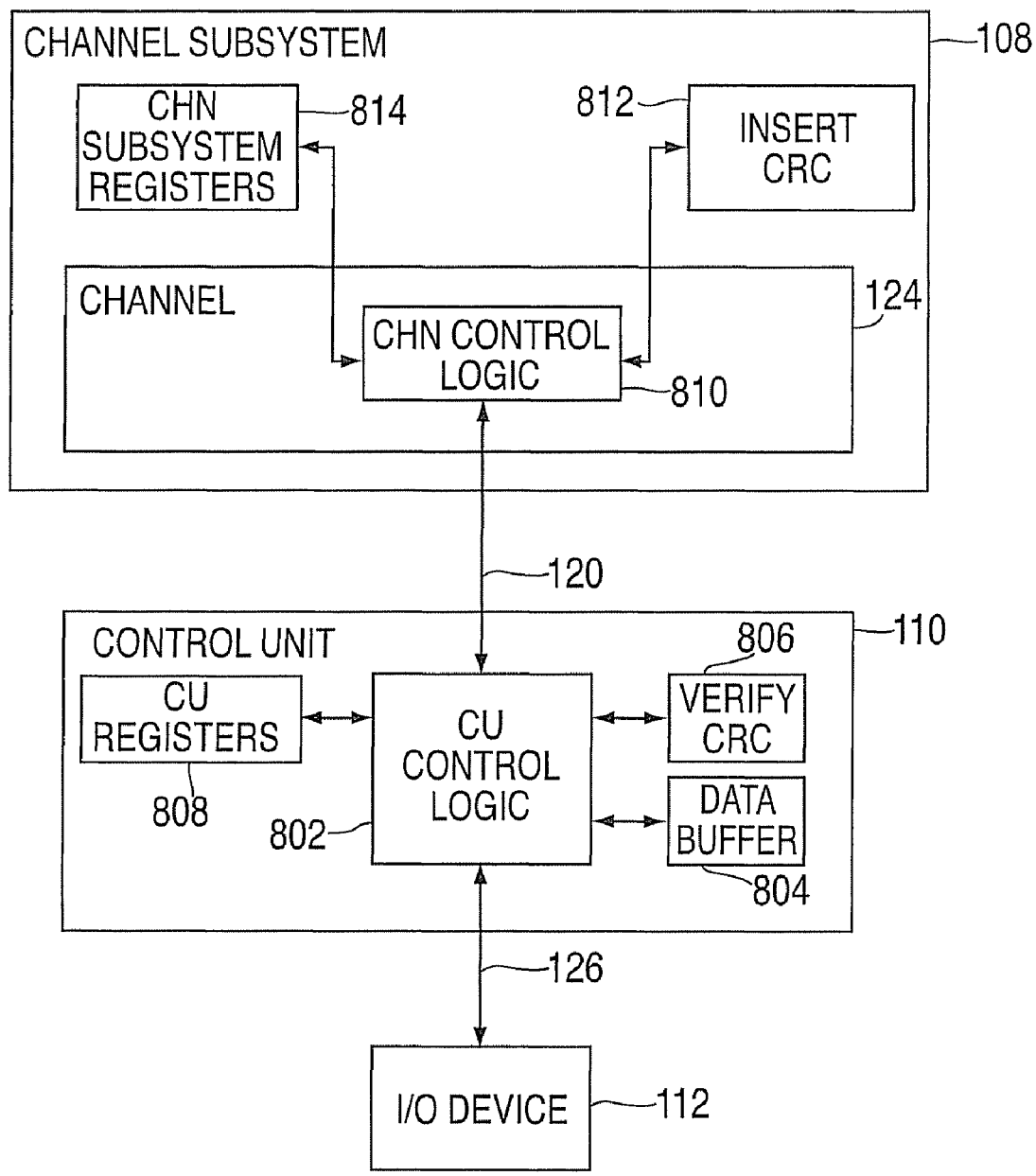
FIG. 8 depicts one embodiment of a control unit and a channel subsystem, in accordance with an aspect of the present invention.

Turning now to FIG. 8, one embodiment of channel 124 in the channel subsystem 108 and the control unit 110 of FIG. 1 that support TCW channel program execution are depicted in greater detail. The control unit 110 includes CU control logic 802 to parse and process messages containing a TCCB, such as the TCCB 704 of FIG. 7, as well as data received from the channel 124 via the connection 120. The CU control logic 802 can extract DCWs and control data from the TCCB received at the control unit 110 to control a device, for instance, I/O device 112 via connection 126. The CU control logic 802 sends device commands and data to the I/O device 112, and receives status information and other feedback from the I/O device 112. When the CU control logic 802 receives data, such as 16K of data 706 of FIG. 7, the CU control logic 802 writes the data received into data buffer 804 for temporary storage. As data is received, verify CRC logic 806 is used to calculate CRC values to verify the integrity of the data. Since the channel subsystem 108 can insert multiple CRCs into the output data stream transmitted over the connection 120, the data buffer 804 can be smaller than the total number of bytes transmitted, with CRC verified blocks of data being forwarded to the I/O device 112. When the I/O device 112 includes permanent storage media, such as a data storage device, the I/O device 112 can store the verified blocks of data incrementally, for example, the 4K blocks with CRCs of the 16K of data 706 of FIG. 7.

The CU control logic 802 accesses and controls other elements within the control unit 110, such as CU registers 808. The CU registers 808 can include fixed values that provide configuration and status information, as well as dynamic status information that is updated as commands are executed by the CU control logic 802. The control unit 110 may further include other queue or memory elements (not depicted) for storing additional message or status information associated with communications between the channel 124 and the I/O device 112.

The channel 124 in the channel subsystem 108 includes elements to support communication with the control unit 110. For example, the channel 124 may include CHN control logic 810 that interfaces with insert CRC logic 812 and CHN subsystem registers 814. In an exemplary embodiment, the CHN control logic 810 controls communication between the channel subsystem 108 and the control unit 110. The CHN control logic 810 may directly interface to the CU control logic 802 via the connection 120 to send commands and receive responses, such as transport command and response IUs. Alternatively, messaging interfaces and/or additional buffers (not depicted) can be placed between the CHN control logic 810 and the CU control logic 802. The CHN control logic 810 recognizes transmission formatting requests, for instance, a request to insert CRCs into the output data stream transmitted to the control unit 110. The CHN subsystem registers 814 can include fixed values that provide configuration and status information, as well as dynamic status information, updated as commands are transported and responses are received. The CHN subsystem registers 814 may be dedicated hardware registers or virtual registers established using memory mapping.

In one embodiment, the CHN subsystem registers 814 include the TIDAL 410 and TIDAWs 412-416 of FIG. 4 as memory mapped registers. The CHN control logic 810 can read one or more flags indicating whether CRC insertion is requested for TIDAWs 412-416, and in response thereto utilize the insert CRC logic 812 to calculate and insert the CRCs using any CRC algorithm known in the art. CRC calculations may be associated with a single TIDAW or span multiple TIDAWs in a TIDAL. In an alternate embodiment, the OS 103 of FIG. 1 can generate the CRCs for CRC insertion The CHN control logic 810 can also insert pad bytes, e.g., zeros, into the output data stream to support fixed size blocks of data for CRC verification. The CHN control logic 810 determines insertion positions for CRCs and optional pad bytes as defined by OS 103 of FIG. 1.

Figure 9:
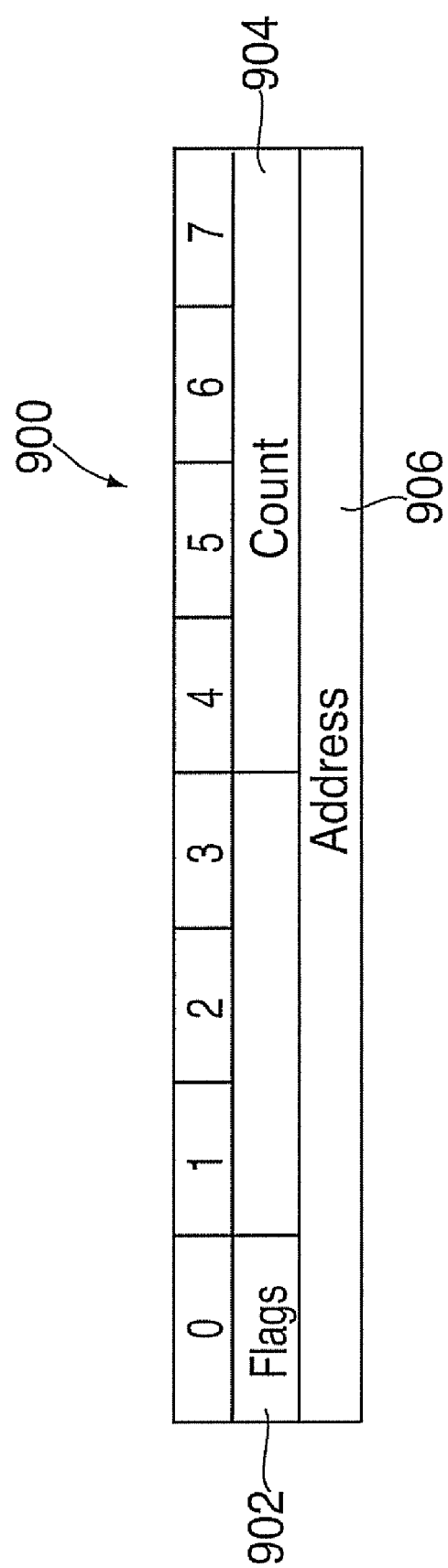
FIG. 9 depicts one embodiment of a transport mode indirect data address word (TIDAW), in accordance with an aspect of the present invention.

One example of a TIDAW 900 is depicted in FIG. 9. The TIDAW 900 provides indirect addressing to data used in a TCW channel program, such as the TIDAWs 412-416 of FIG. 4. The TIDAW 900 includes flags 902, a count 904, and an address 906. Each field (i.e., flags 902, count 904, and address 906) in the TIDAW format 900 is assigned to a particular byte address to support parsing of the fields. Although one arrangement of fields within the TIDAW 900 is depicted in FIG. 9, it will be understood that the order of fields can be rearranged to alternate orderings.

In an exemplary embodiment, the flags 902 include a last TIDAW flag and an insert CRC flag, in addition to other flags. The last TIDAW flag indicates that the associated TIDAW is the last TIDAW in a TIDAL, consistent with the definition for a MIDAW. When count 904 goes to zero with the last TIDAW flag set, the data transfer for the associated I/O operation is complete. The insert CRC flag indicates that CRC insertion is to be performed with the associated TIDAW. When the insert CRC flag is set, pad bytes and a CRC word are inserted in the output data stream after transferring the amount of data specified in the count 904. The count 904 may be used to control the number of bytes of data fetched or stored at the address 906. The insert CRC logic 812 and CHN control logic 810 of FIG. 8 can be used to insert the CRC and pad bytes in the output data stream. Once a CRC is inserted, data transfer continues, and a new CRC calculation is started to generate the next CRC. When writing data for a data storage device, CRC insertion may be configured to insert a CRC on a record or track boundary, allowing the control unit 110 to completely verify a record or track prior to committing it to permanent storage. A CRC can also be appended when the final byte of data is transmitted, regardless of whether the insert CRC flag is set.

Figure 10:
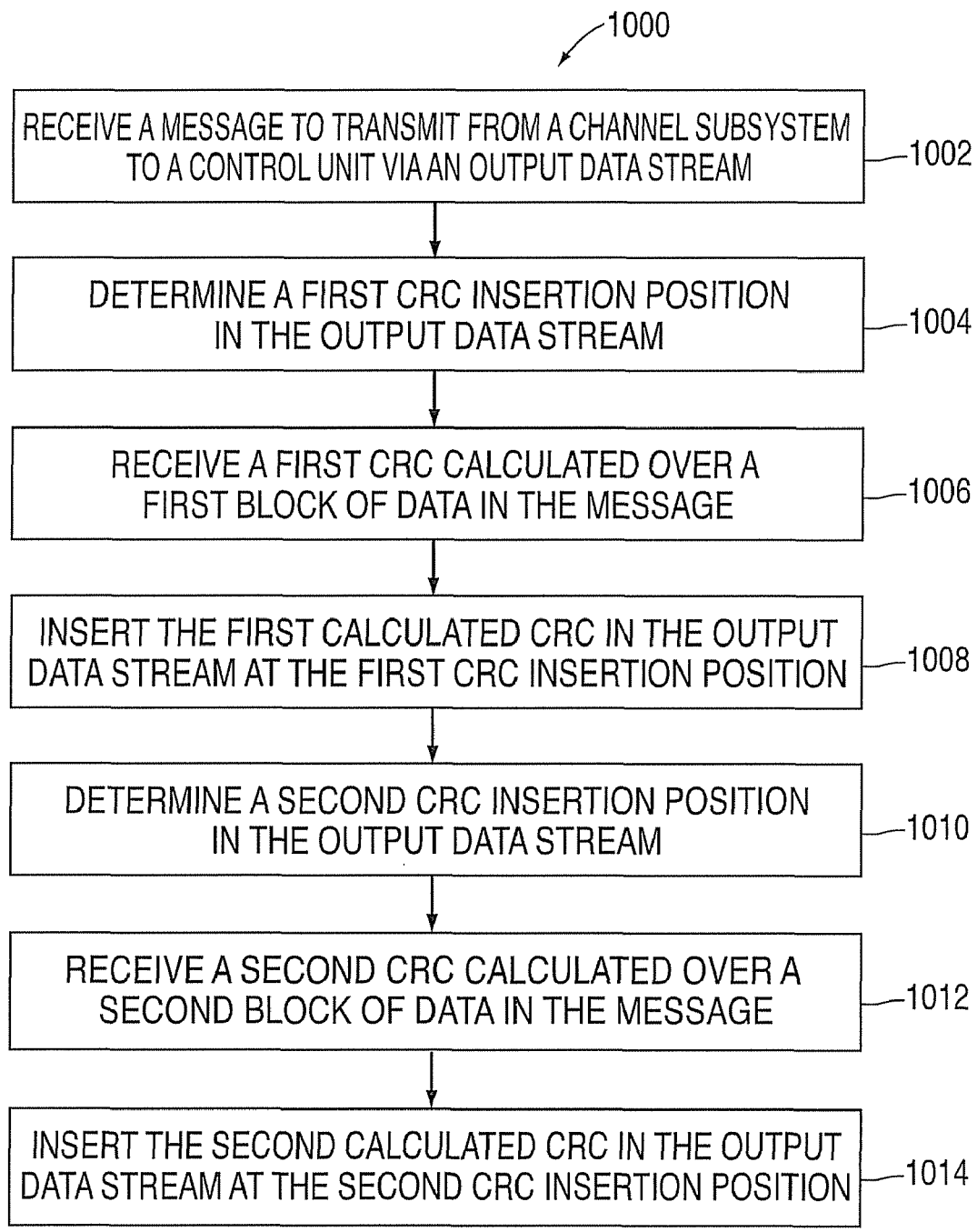
FIG. 10 depicts one embodiment of a process for insertion of multiple CRCs in an output data stream in an I/O processing system.

Turning now to FIG. 10, a process 1000 for inserting multiple CRCs in an output data stream from a channel subsystem to a control unit of an I/O processing system will now be described in accordance with exemplary embodiments, and in reference to the I/O processing system 100 of FIG. 1. At block 1002, the channel subsystem 108 receives a message to transmit from the channel subsystem 108 to the control unit 110 via the output data stream. The message may be a data message associated with one or more write commands in a TCW channel program, e.g., 16K of data 706 of FIG. 7. The output data stream can be sent over the channel path 122, with the CHN control logic 810 communicating with the CU control logic 802 of FIG. 8.

At block 1004, the channel subsystem 108 determines a first CRC insertion position in the output data stream. The insert CRC logic 812 of FIG. 8 can determine the first CRC insertion position based on the count 904 of TIDAW 900 of FIG. 9. The first CRC insertion position can be adjusted by a variable number of pad bytes to extend a data block to predefined boundary upon which a CRC is calculated.

At block 1006, the channel subsystem 108 receives a first CRC calculated over a first block of data in the message to transmit. At block 1008, the channel subsystem 108 inserts the first calculated CRC in the output data stream at the first CRC insertion position. At block 1010, the channel subsystem 108 determines a second CRC insertion position in the output data stream. At block 1012, the channel subsystem 108 receives a second CRC calculated over a second block of data in the message. At block 1014, the channel subsystem 108 inserts the second calculated CRC in the output data stream at the second CRC insertion position. The first block may represent the first 4K, while the second block represents the second 4K of the 16K of data 706 of FIG. 7. The process continues with subsequent blocks until a complete message is transmitted with multiple CRCs to the control unit 110. The data block size for the blocks may be selected as a track size or record size of a data storage device (e.g., I/O device 112) in communication with the control unit 110. The insert CRC logic 812 is used to calculate and insert the CRCs. OS 103 configures one or more TIDAWs in a TIDAL (e.g., TIDAWs 412-416 in TIDAL 410) to insert CRCs and establish CRC insertion positions based on knowledge of the control unit 110 and I/O device 112 characteristics (e.g., buffer, record, and track sizes). The final block transmitted may be smaller in size relative to other blocks if it contains a partial record or track of data.

Technical effects of exemplary embodiments include inserting multiple CRCs in an output data stream from a channel subsystem to a control unit of an I/O processing system. Advantages include allowing a control unit to incrementally verify a large data message without subdividing the message into individual smaller messages. Large block transfers can reduce communication overhead by avoiding additional handshaking and other delays associated with multiple smaller messages. Placing CRCs on record or track boundaries in a message allows a control unit to fully verify each record or track before committing it to permanent storage, and may enable individual records or tracks to be accepted or rejected rather than rejecting a full message containing many valid records or tracks.

Figure 11:
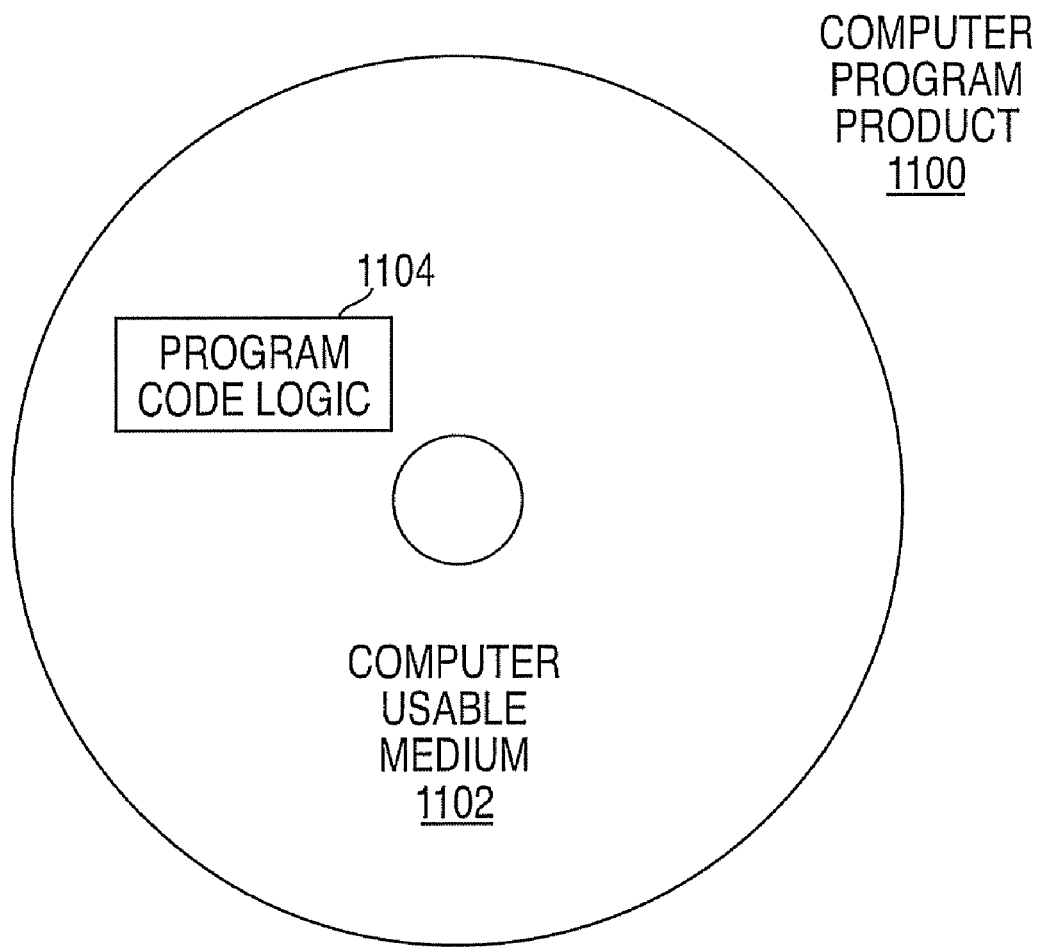
FIG. 11 depicts one embodiment of a computer program product incorporating one or more aspects of the present invention.

As described above, embodiments can be embodied in the form of computer-implemented processes and apparatuses for practicing those processes. In exemplary embodiments, the invention is embodied in computer program code executed by one or more network elements. Embodiments include a computer program product 1100 as depicted in FIG. 11 on a computer usable medium 1102 with computer program code logic 1104 containing instructions embodied in tangible media as an article of manufacture. Exemplary articles of manufacture for computer usable medium 1102 may include floppy diskettes, CD-ROMs, hard drives, universal serial bus (USB) flash drives, or any other computer-readable storage medium, wherein, when the computer program code logic 1104 is loaded into and executed by a computer, the computer becomes an apparatus for practicing the invention. Embodiments include computer program code logic 1104, for example, whether stored in a storage medium, loaded into and/or executed by a computer, or transmitted over some transmission medium, such as over electrical wiring or cabling, through fiber optics, or via electromagnetic radiation, wherein, when the computer program code logic 1104 is loaded into and executed by a computer, the computer becomes an apparatus for practicing the invention. When implemented on a general-purpose microprocessor, the computer program code logic 1104 segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A computer program product for inserting multiple cyclic redundancy checks (CRCs) in an output data stream from a channel subsystem to a control unit of an input/output (I/O) processing system, the computer program product comprising:

a tangible storage medium readable by a processing circuit and storing instructions for execution by the processing circuit for performing a method comprising:
receiving a message to transmit from the channel subsystem to the control unit via the output data stream;
determining a first CRC insertion position in the output data stream;
receiving a first CRC calculated over a first block of data in the message;
inserting the first calculated CRC in the output data stream at the first CRC insertion position;
determining a second CRC insertion position in the output data stream;
receiving a second CRC calculated over a second block of data in the message; and
inserting the second calculated CRC in the output data stream at the second CRC insertion position.

2. The computer program product of claim 1 wherein the method further comprises:
inserting pad bytes extended to a predefined boundary in the output data stream.

3. The computer program product of claim 1 wherein an operating system calculates and provides the first and second calculated CRCs to the channel subsystem.

4. The computer program product of claim 1 wherein at least one of the first and second blocks of data is selected as a track size or record size of a data storage device in communication with the control unit.

5. The computer program product of claim 1 wherein the message is a data message associated with one or more write commands in a transport control word (TCW) channel program.

6. The computer program product of claim 1 wherein the method further comprises:
identifying a CRC insertion request via a flag in a transport mode indirect data address word (TIDAW), wherein determining the first CRC insertion position is preformed in response to the CRC insertion request.

7. The computer program product of claim 6 wherein the TIDAW further comprises a count field and an address field, the count field indicating a number of bytes to read from an address in the address field and transmit on the output stream prior to inserting the first calculated CRC.

8. The computer program product of claim 6 wherein the TIDAW is linked to a second TIDAW in a transport mode indirect data address list (TIDAL).

9. An apparatus for inserting multiple cyclic redundancy checks (CRCs) in an output data stream in an input/output (I/O) processing system, the apparatus comprising:
a channel subsystem in communication with a control unit in the I/O processing system, the channel subsystem performing a method comprising:
receiving a message to transmit from the channel subsystem to the control unit via the output data stream;
determining a first CRC insertion position in the output data stream;
receiving a first CRC calculated over a first block of data in the message;
inserting the first calculated CRC in the output data stream at the first CRC insertion position;
determining a second CRC insertion position in the output data stream;
receiving a second CRC calculated over a second block of data in the message; and
inserting the second calculated CRC in the output data stream at the second CRC insertion position.

10. The apparatus of claim 9 wherein the channel subsystem further performs:
inserting pad bytes extended to a predefined boundary in the output data stream.

11. The apparatus of claim 9 wherein an operating system in the I/O processing system calculates and provides the first and second calculated CRCs to the channel subsystem.

12. The apparatus of claim 9 wherein at least one of the first and second blocks of is selected as a track size or record size of a data storage device in communication with the control unit.

13. The apparatus of claim 9 wherein the message is a data message associated with one or more write commands in a transport control word (TCW) channel program.

14. The apparatus of claim 9 wherein the channel subsystem further performs:
identifying a CRC insertion request via a flag in a transport mode indirect data address word (TIDAW), wherein determining the first CRC insertion position is performed in response to the CRC insertion request.

15. The apparatus of claim 14 wherein the TIDAW further comprises a count field and an address field, the count field indicating a number of bytes to read from an address in the address field and transmit on the output stream prior to inserting the first calculated CRC.

16. The apparatus of claim 14 wherein the TIDAW is linked to a second TIDAW in a transport mode indirect data address list (TIDAL).

17. A method for inserting multiple cyclic redundancy checks (CRCs) in an output data stream from a channel subsystem to a control unit of an input/output (I/O) processing system, the method comprising:
receiving a message to transmit from the channel subsystem to the control unit via the output data stream;
determining a first CRC insertion position in the output data stream;
receiving a first CRC calculated over a first block of data in the message;
inserting the first calculated CRC in the output data stream at the first CRC insertion position;
determining a second CRC insertion position in the output data stream;
receiving a second CRC calculated over a second block of data in the message; and
inserting the second calculated CRC in the output data stream at the second CRC insertion position.

18. The method of claim 17 further comprising:
inserting pad bytes extended to a predefined boundary in the output data stream.

19. The method of claim 17 wherein an operating system calculates and provides the first and second calculated CRCs to the channel subsystem.

20. The method of claim 17 wherein at least one of the first and second blocks of data is selected as a track size or record size of a data storage device in communication with the control unit.

21. The method of claim 17 wherein the message is a data message associated with one or more write commands in a transport control word (TCW) channel program.

22. The method of claim 17 further comprising:
identifying a CRC insertion request via a flag in a transport mode indirect data address word (TIDAW), wherein determining the first CRC insertion position is performed in response to the CRC insertion request.

23. The method of claim 22 wherein the TIDAW further comprises a count field and an address field, the count field indicating a number of bytes to read from an address in the address field and transmit on the output stream prior to inserting the first calculated CRC.

24. The method of claim 22 wherein the TIDAW is linked to a second TIDAW in a transport mode indirect data address list (TIDAL).

* * * * *